United States Patent
Ebisawa

(10) Patent No.: US 10,792,747 B2
(45) Date of Patent: Oct. 6, 2020

(54) SOLDER PROCESSING DEVICE

(71) Applicant: AND Co., Ltd., Souraku-gun, Kyoto (JP)

(72) Inventor: Mitsuo Ebisawa, Kizugawa (JP)

(73) Assignee: AND Co., Ltd., Souraku-gun (JP)

( * ) Notice: Subject to any disclaimer, the term of this patent is extended or adjusted under 35 U.S.C. 154(b) by 273 days.

(21) Appl. No.: 15/558,562

(22) PCT Filed: Mar. 15, 2016

(86) PCT No.: PCT/JP2016/058086
§ 371 (c)(1),
(2) Date: Sep. 15, 2017

(87) PCT Pub. No.: WO2016/147126
PCT Pub. Date: Sep. 22, 2016

(65) Prior Publication Data
US 2018/0056423 A1    Mar. 1, 2018

(30) Foreign Application Priority Data
Mar. 16, 2015    (JP) .................................. 2015-051573

(51) Int. Cl.
*B23K 3/06*    (2006.01)
*H05K 3/34*    (2006.01)
(Continued)

(52) U.S. Cl.
CPC .......... *B23K 3/0615* (2013.01); *B23K 1/0016* (2013.01); *B23K 3/02* (2013.01);
(Continued)

(58) Field of Classification Search
CPC ...................................................... B23K 3/00
See application file for complete search history.

(56) References Cited

U.S. PATENT DOCUMENTS 4,606,492 A * 8/1986 Guslits ................. B23K 3/0615
228/179.1
5,163,600 A * 11/1992 Barbarich ................ B23K 3/03
219/229

(Continued)

FOREIGN PATENT DOCUMENTS

JP    H9-108826 A     4/1997
JP    2007-290026 A   11/2007

(Continued)

OTHER PUBLICATIONS

The International Search Report (ISR) of PCT/JP2016/058086 dated Apr. 26, 2016.

*Primary Examiner* — Devang R Patel
(74) *Attorney, Agent, or Firm* — Metrolex IP Law Group, PLLC

(57) ABSTRACT

A substantially tubular iron tip (5) that can be heated and that is extended vertically and a solder piece supply portion that supplies a first solder piece (Wh1) and a second solder piece (Wh2) in which a layer of a flux (72) is provided within a tubular solder layer in this order from above into the iron tip are provided, within the iron tip, the solder pieces are erected such that on the first solder piece, the second solder piece rides and the heat of the iron tip is used to melt the first solder piece and the second solder piece such that the molten solder is supplied downward. In this way, it is possible to more reliably heat and melt the solder pieces in a posture in which they are erected within the iron tip.

13 Claims, 6 Drawing Sheets

(51) Int. Cl.
   *B23K 1/00* (2006.01)
   *B23K 3/03* (2006.01)
   *B23K 3/02* (2006.01)
   B23K 101/42 (2006.01)
(52) U.S. Cl.
   CPC ............... *B23K 3/03* (2013.01); *B23K 3/063* (2013.01); *H05K 3/34* (2013.01); *B23K 2101/42* (2018.08)

(56) References Cited

U.S. PATENT DOCUMENTS

| | | | | |
|---|---|---|---|---|
| 5,605,276 | A * | 2/1997 | Nagata | B23K 3/063 228/180.1 |
| 6,744,003 | B1 * | 6/2004 | Ono | B23K 3/025 219/85.16 |
| 8,740,040 | B2 * | 6/2014 | Choi | B23K 3/0623 228/256 |
| 2015/0352652 | A1 * | 12/2015 | Goodman | B23K 1/0016 228/104 |

FOREIGN PATENT DOCUMENTS

| | | |
|---|---|---|
| JP | 2009-195938 A | 9/2009 |
| JP | 2011-056581 A | 3/2011 |
| WO | 2008/023461 A1 | 2/2008 |

* cited by examiner

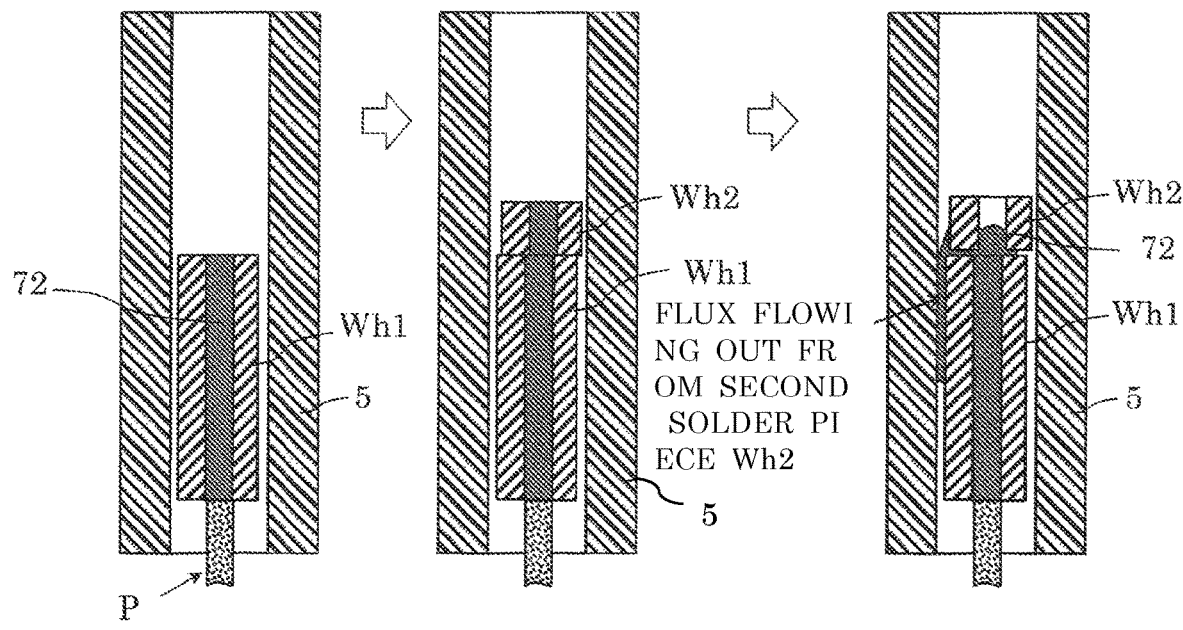
Fig. 7A    Fig. 7B    Fig. 7C
Fig. 8
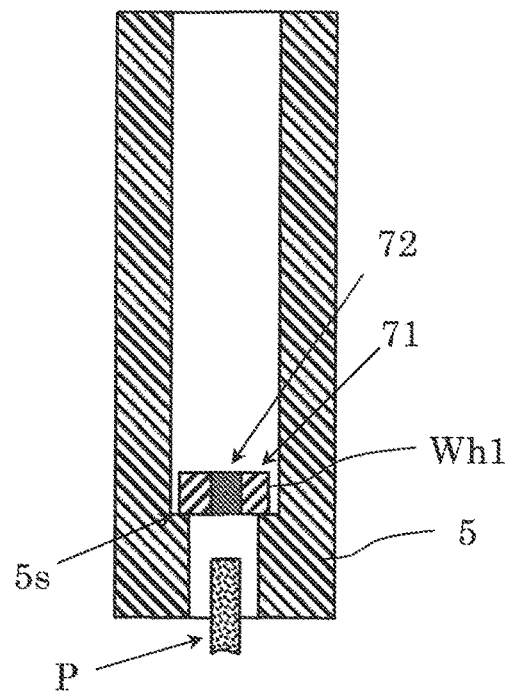

MOLTEN FIRST SOLDER PIECE Wh1

FLUX MELTED OUT FROM FIRST SOLDER PIECE Wh1

SOLDER PROCESSING DEVICE

TECHNICAL FIELD

The present invention relates to a solder processing device which heats and melts a solder piece.

BACKGROUND ART

In recent years, electronic circuits on which electronic components are mounted have been incorporated in various types of devices. In a step of forming an electronic circuit, in order to perform, for example, processing for joining a lead wire to a wiring pattern (land) on a board, soldering using a soldering iron is performed. In order to mechanically realize a soldering step, a solder processing device having a portion of an iron tip is utilized.

For example, the solder processing device as described above is configured such that a solder piece (piece obtained by cutting a wire solder in which a layer of a flux is provided within a solder layer) is heated in a posture where the solder piece is erected within the iron tip and that thus the molten solder is supplied downward. In this way, it is possible to realize the soldering step on the board arranged below.

RELATED ART DOCUMENT

Patent Document

Patent Document 1: Japanese Unexamined Patent Application Publication No. 09-108826
Patent Document 2: Japanese Unexamined Patent Application Publication No. 2011-056581
Patent Document 3: Japanese Unexamined Patent Application Publication No. 2009-195938

DISCLOSURE OF THE INVENTION

Problems to be Solved by the Invention

When as described above, the solder piece is heated in the posture where the solder piece is erected within the iron tip, the flux having a relatively low melting point stats to flow out from the solder piece. When the flux appropriately flows out from the upper end or the side surface of the solder piece, the flux excellent in wettability is appropriately interposed between the inner wall of the iron tip and the solder piece. Consequently, contactability between the inner wall of the iron tip and the solder piece is enhanced, and thus heat is sufficiently transmitted from the iron tip to the solder piece, with the result that it is possible to appropriately heat and melt the solder piece.

However, when the solder piece is heated in the posture where the solder piece is erected within the iron tip, it is likely that the flux easily flows out from the lower end of the solder piece. In this case, the flux flows downward of the solder piece, and thus it is unlikely that the flux is interposed between the inner wall of the iron tip and the solder piece.

Consequently, it is likely that heat is not sufficiently transmitted from the iron tip to the solder piece and that thus the solder piece cannot be appropriately heated and melted. In view of the foregoing problem, the present invention has an object to provide a solder processing device which can more reliably heat and melt a solder piece in a posture where the solder piece is erected within an iron tip.

Means for Solving the Problem

A solder processing device according to the present invention includes: a substantially tubular iron tip that can be heated and that is extended vertically; and a solder piece supply portion that sequentially supplies, into the iron tip, a plurality of solder pieces in which a layer of a flux is provided within a tubular solder layer, within the iron tip, the solder pieces are erected such that on the solder piece which is first supplied, the solder piece which is subsequently supplied rides and the heat of the iron tip is used to melt the solder pieces such that the molten solder is supplied downward.

In this configuration, it is possible to more reliably heat and melt the solder pieces in a posture where they are erected within the iron tip.

In the configuration described above, more specifically, the solder piece supply portion may sequentially produce a first solder piece and a second solder piece by cutting a wire solder, and supply the first and second solder pieces into the iron tip.

In the configuration described above, more specifically, the solder piece supply portion may cut the wire solder such that the first solder piece differs in length from the second solder piece.

In the configuration described above, more specifically, the solder processing device solders a terminal protruded upward to a board, and the supply may be performed in a state where a tip end of the terminal enters the iron tip from below such that the first solder piece is erected on the tip end of the terminal.

In the configuration described above, more specifically, the solder piece supply portion may cut the wire solder such that the second solder piece is shorter than the first solder piece.

In the configuration described above, more specifically, within the iron tip, a reception portion which receives the supplied first solder piece may be provided, and the first solder piece may be erected on the reception portion. In the configuration described above, more specifically, the reception portion may be protruded inward from the inner wall of the iron tip such that the inside diameter of the iron tip is smaller than the outside diameter of the first solder piece.

In the configuration described above, more specifically, the solder piece supply portion may cut the wire solder such that the first solder piece is shorter than the second solder piece.

In a solder processing method according to the present invention, a plurality of solder pieces in which a layer of a flux is provided within a tubular solder layer are sequentially supplied into a substantially tubular iron tip that can be heated and that is extended vertically, within the iron tip, the solder pieces are erected such that on the solder piece which is first supplied, the solder piece which is subsequently supplied rides and the heat of the iron tip is used to melt the solder pieces such that the molten solder is supplied downward.

Advantages of the Invention

With the solder processing device according to the present invention, it is possible to more reliably heat and melt a solder piece in a posture where the solder piece is erected within an iron tip.

BRIEF DESCRIPTION OF DRAWINGS

FIG. 7A An illustrative diagram for the supply and the heating and melting of solder pieces according to a second embodiment;

FIG. 7B An illustrative diagram for the supply and the heating and melting of solder pieces according to a second embodiment;

FIG. 7C An illustrative diagram for the supply and the heating and melting of solder pieces according to a second embodiment;

FIG. 8 An illustrative diagram of a state where the first solder piece is held within an iron tip in a third embodiment;

DESCRIPTION OF EMBODIMENTS

Embodiments of the present invention will be described below using, as examples, first to third embodiments with reference to drawings. The details of the present invention are not limited at all to these embodiments.

1. First Embodiment

[Overall Configuration of Soldering Device]

Figure 1:
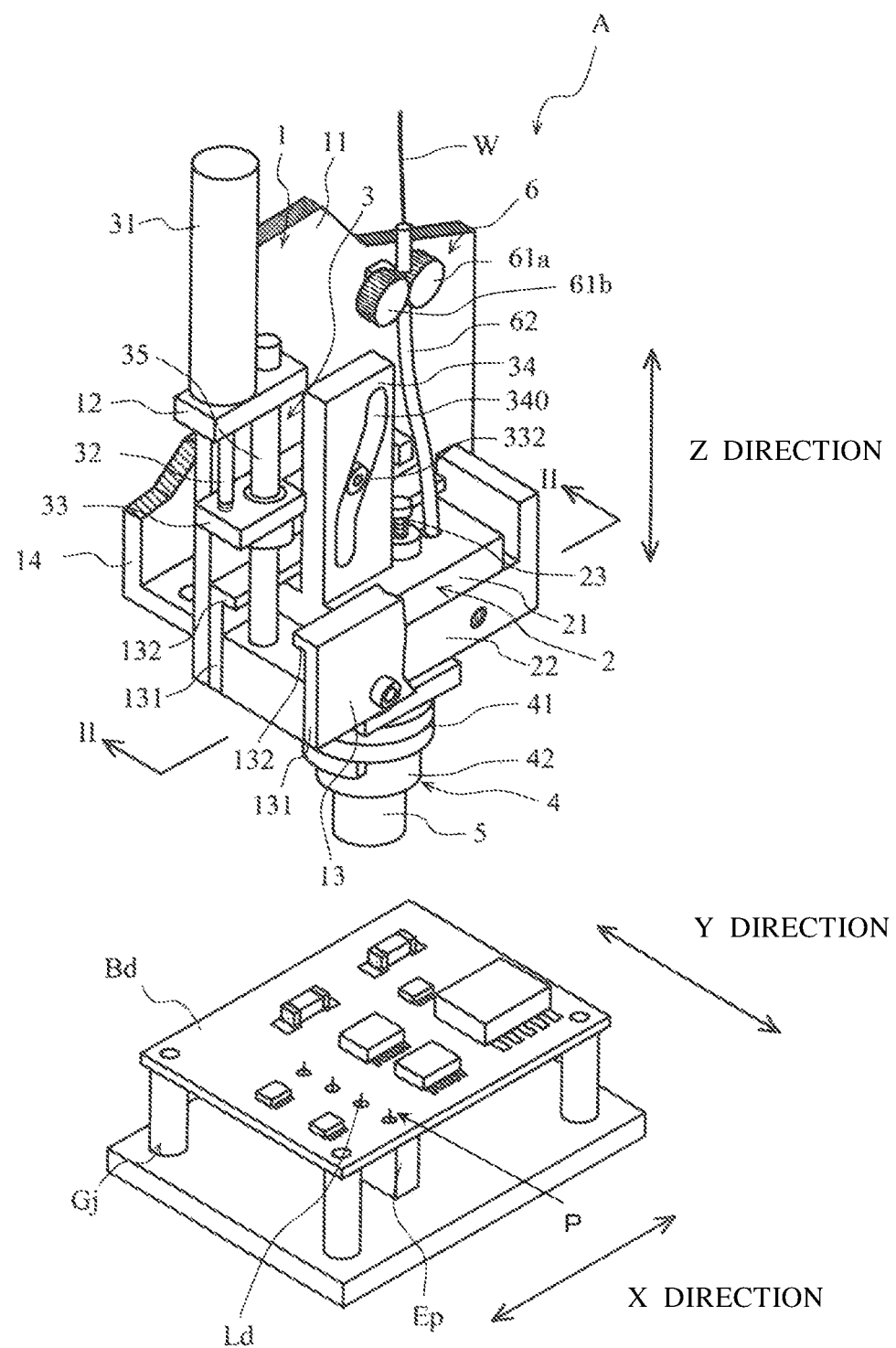
FIG. 1 A perspective view of an example of a soldering device according to an embodiment of the present invention.
Figure 2:
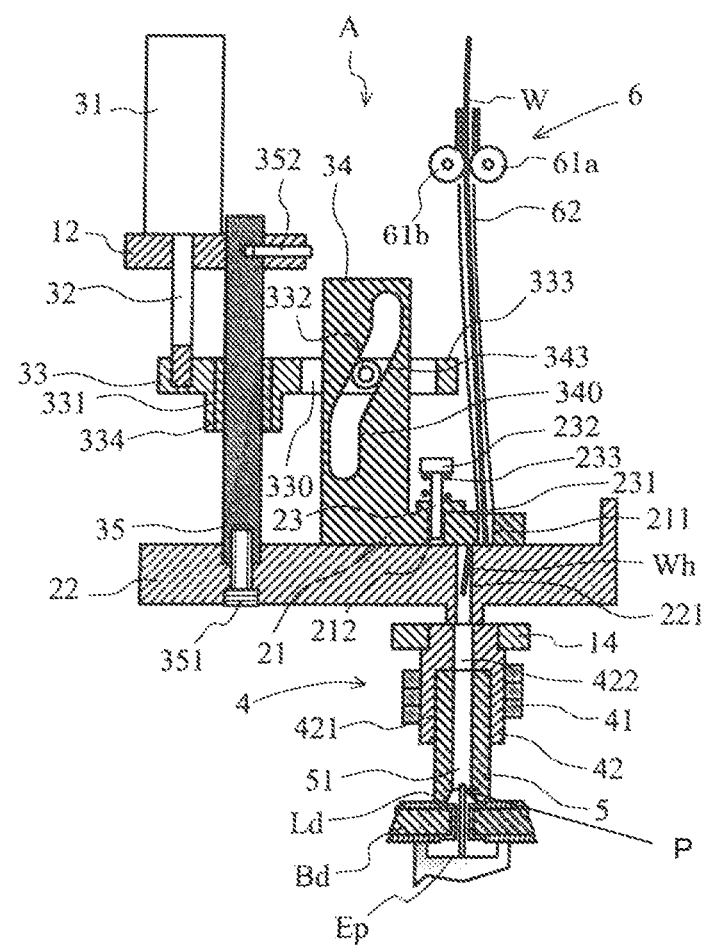
FIG. 2 A cross-sectional view taken along line II-II in the soldering device shown in FIG. 1.
Figure 3:
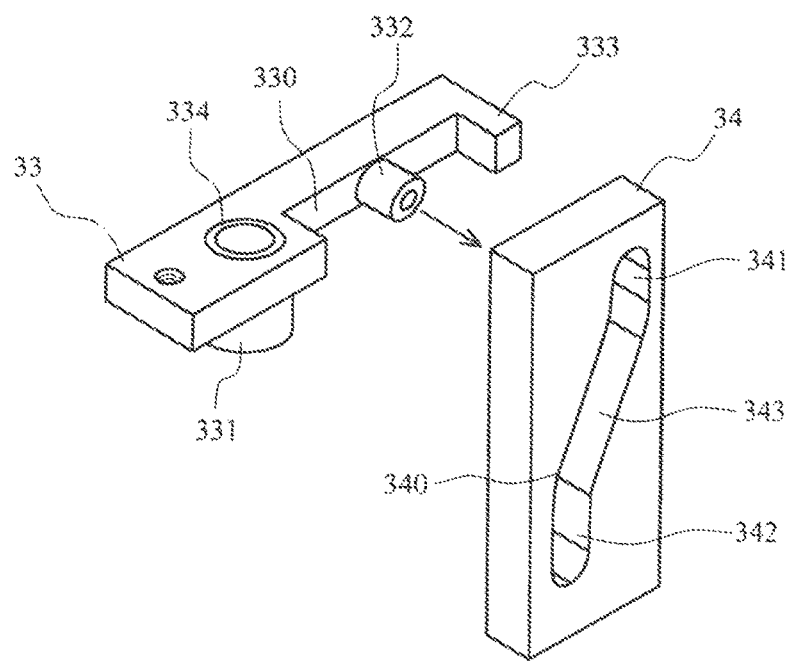
FIG. 3 An exploded perspective view of part of a drive mechanism provided in the soldering device shown in FIG. 1.

FIG. 1 is a perspective view of a soldering device (one form of a solder processing device) according to the first embodiment, FIG. 2 is a cross-sectional view taken along line II-II in the soldering device A shown in FIG. 1 and FIG. 3 is an exploded perspective view of part of a drive mechanism provided in the soldering device A shown in FIG. 1. In FIG. 1, parts of an enclosure and a support portion 1 are cut out, and thus the interior of the soldering device A is displayed.

As shown in FIG. 1, the soldering device A is a device in which a wire solder W is supplied from above, and in which an iron tip 5 provided in a lower portion is utilized so as to solder a wiring board Bd arranged below the iron tip 5 and an electronic component Ep. The wire solder W has a structure in which a flux layer is provided within a tubular solder layer. Hence, a solder piece produced by cutting the wire solder W likewise has the structure in which the flux layer is provided within the tubular solder layer. The soldering device A includes the support portion 1, a cutter unit 2, the drive mechanism 3, a heater unit 4, the iron tip 5 and a solder feed mechanism 6. A combination of the heater unit 4 and the iron tip 5 forms a soldering iron portion.

The support portion 1 includes a wall member 11 which is provided so as to stand and which is formed in the shape of a flat plate. In the following description, for convenience, it is assumed that as shown in FIG. 1, a horizontal direction along the wall member 11 is an X direction, that a horizontal direction perpendicular to the wall member 11 is a Y direction and that a vertical direction along the wall member 11 is a Z direction. For example, as shown in FIG. 1, the wall member 11 has a Z-X flat surface.

The soldering device A supplies molten solder to the wiring board Bd attached to a jig fixture Gj and a terminal P of the electronic component Ep arranged on the wiring board Bd, and thereby connects and fixes them. When soldering is performed, the jig fixture Gj is moved in the X direction and the Y direction so as to locate a land Ld on the wiring board Bd. Then, the soldering device A can be moved in the Z direction, and after the location, the soldering device A is moved in the Z direction, and thus it is possible to bring the tip end of the iron tip 5 into contact with the land Ld.

The support portion 1 includes: a holding portion 12 which is provided in a position displaced upward from a lower end portion of the wall member 11 in the Z direction; a sliding guide 13 which is fixed to a side edge portion (lower portion) of the wall member 11 in the Z direction; and a heater unit fixing portion 14 which is provided at an end portion (lower end portion) of the wall member 11 in the Z direction.

The cutter unit 2 cuts the wire solder W fed by the solder feed mechanism 6 into a solder piece Wh which has a predetermined length. Although described in detail later, the soldering device A heats the iron tip 5 in a state where a first solder piece Wh1 and a second solder piece Wh2 are supplied into the iron tip 5, and supplies the molten solder downward. In the following description, the first solder piece Wh1 and the second solder piece Wh2 are collectively referred to as the solder piece Wh.

The cutter unit 2 includes: a cutter lower blade 22 (fixed blade portion) which is fixed to the sliding guide 13; a cutter upper blade 21 (movable blade portion) which is arranged in an upper portion of the cutter lower blade 22 and which is arranged so as to be able to slide in the X direction; and a pusher pin 23 (solder pushing portion) which is provided in the cutter upper blade 21 and which slides in a direction (Z direction) intersecting the direction of sliding of the cutter upper blade 21. As shown in FIG. 1, the movement of the cutter upper blade 21 in the Z direction is restricted by the sliding guide 13, and the cutter upper blade 21 can slide in the X direction.

Here, the sliding guide 13 will be described in detail. The sliding guide 13 includes a pair of wall portions 131 which make contact with both ends of the cutter lower blade 22 in the Y direction, and the pair of wall portions 131 include stopper portions 132 which are protruded toward the other side. In the stopper portions 132, tip ends are prevented from making contact with each other, and in other words, an opening is provided in an upper portion of the sliding guide 13. The stopper portions 132 restrict the movement of the cutter upper blade 21 in the Z direction.

As shown in FIG. 2, the cutter upper blade 21 includes an upper blade hole 211 that is a through hole into which the wire solder W fed by the solder feed mechanism 6 is inserted and a pin hole 212 that is a through hole into which the rod portion 231 of the pusher pin 23 is inserted. The side edge portion of the upper blade hole 211 at the lower end is formed in the shape of a cutting blade. The cutter lower blade 22 includes a lower blade hole 221 that is a through hole into which the wire solder W passing through the upper blade hole 211 is inserted. The side edge portion of the lower blade hole 221 at the upper end is formed in the shape of a cutting blade. In a state where the wire solder W is inserted into the upper blade hole 211 and the lower blade hole 221, they are displaced in a direction intersecting the wire solder W, and thus the wire solder W is cut by the cutting blades thereof.

The pusher pin 23 is the solder pushing portion, and pushes downward the solder piece Wh which is left in the lower blade hole 221 after being cut by the cutter upper blade 21 and the cutter lower blade 22. The pusher pin 23 includes: the rod portion 231 which is slidably supported in the pin hole 212; a head portion 232 which is provided at the end portion of the rod portion 231; and a spring 233 which is wound around the rod portion 231 and which is arranged between the head portion 232 and the cutter upper blade 21. Furthermore, in the pusher pin 23, at the end portion of the rod portion 231 on the side opposite to the head portion 232, a stopper for reducing the removal of the rod portion 231 from the pin hole 212 is provided. The pusher pin 23 is constantly raised upward, that is, to the side opposite to the cutter lower blade 22 by the elastic force of the spring 233.

As shown in FIGS. 1 and 2, the drive mechanism 3 includes: an air cylinder 31 which is held by the holding portion 12; a piston rod 32 which passes through a through hole provided in the holding portion 12 and which is driven by the air cylinder 31 so as to slide in the Z direction; and a guide shaft 35 which is supported both by the holding portion 12 and the cutter lower blade 22, which is extended in the Z direction and which is formed in the shape of a cylinder. The drive mechanism 3 further includes: a cam member 33 that is supported by the guide shaft 35 so as to be able to slide in the Z direction; and a slider portion 34 that includes a cam groove 340 with which a pin 332 provided in the cam member 33 and described later is engaged.

The air cylinder 31 drives the piston rod 32 such that the piston rod 32 slides (expands and contracts) by the pressure of air supplied from the outside, and the air cylinder 31 and the piston rod 32 form the actuator of the drive mechanism 3. The piston rod 32 is provided parallel to the guide shaft 35, and linearly reciprocates along the guide shaft 35. A tip end portion of the piston rod 32 is fixed to the cam member 33, and the cam member 33 slides in the Z direction by the expansion and contraction of the piston rod 32. The sliding of the cam member 33 is guided by the guide shaft 35.

As shown in FIG. 2, a lower end portion of the guide shaft 35 is fitted into a concave hole provided in the cutter lower blade 22, and the guide shaft 35 is screwed and fixed to the cutter lower blade 22 with a screw 351. An upper portion of the guide shaft 35 passes through a hole provided in the holding portion 12, and the movement thereof is restricted by a pin 352. In other words, the guide shaft 35 is fixed with the screw 351 to the cutter lower blade 22 and is fixed with the pin 352 to the holding portion 12.

As shown in FIGS. 2 and 3, the cam member 33 is a rectangular member, and includes: a concave portion 330 that is obtained by cutting out part of a long side into a rectangular shape; and a cylindrical support portion 331 that is coupled to the cam member 33 and that includes a through hole through which the guide shaft 35 passes. In the concave portion 330, the slider portion 34 is arranged slidably (in the X direction and the Z direction). The support portion 331 is shaped so as to extend in a direction parallel to the pin 35, and is provided so as to reduce the rattling of the cam member 33. In other words, when the cam member 33 has a certain degree of thickness, and thus it is unlikely that rattling occurs, the cylindrical portion may be omitted such that only the through hole forms the support portion 331.

The cam member 33 further includes: the cylindrical pin 332 which is provided in an intermediate portion of the concave portion 330 and whose center axis is perpendicular to the guide shaft 35; a pin pushing portion 333 which is adjacent to the concave portion 330 and which pushes the pusher pin 23; and a bearing 334 which is arranged within the support portion 331. The pin 332 is inserted into the cam groove 340 which is provided in the slider portion 34 and which will be described later. The bearing 334 is a member which is externally fitted to the guide shaft 35 and which makes cam member 33 smoothly slide such that the cam member 33 is prevented from rattling.

As shown in FIGS. 2 and 3, the slider portion 34 is a member which is formed in the shape of a rectangular plate, and is formed integrally with the cutter upper blade 21. The slider portion 34 includes the cam groove 340 which passes through the plate in the direction of thickness of the plate and which is extended in a longitudinal direction. The cam groove 340 includes a first groove portion 341 on the upper side which is extended parallel to the guide shaft 35 and a second groove portion 342 on the lower side which is extended parallel to the guide shaft 35. The first groove portion 341 and the second groove portion 342 are provided so as to be displaced from each other in the X direction, and the cam groove 340 includes a connection groove portion 343 which connects the first groove portion 341 and the second groove portion 342.

The pin 332 of the cam member 33 is inserted into the cam groove 340, the cam member 33 is moved along the guide shaft 35 and thus the pin 332 slides on the inner surface of the cam groove 340. When the pin 332 is located in the connection groove portion 343 of the cam groove 340, the pin 332 pushes the inner surface of the connection groove portion 343. In this way, the slider portion 34 and the cutter upper blade 21 formed integrally with the slider portion 34 are moved (slide with respect to the cutter lower blade 22) in a direction (X direction) intersecting the direction of sliding of the cam member 33 (Z direction).

As shown in FIG. 2, the heater unit 4 is a heating device for heating and melting the solder piece Wh, and is fixed to the heater unit fixing portion 14 provided in a lower end portion of the wall member 22. The heater unit 4 includes a heater 41 which generates heat by passing electricity and a heater block 42 for attaching the heater 41. The heater 41 is wound around the outer circumferential surface of the cylindrical heater block 42.

The heater block 42 has a cylindrical shape, and includes: a concave portion 421 which is used for attaching the iron tip 5 to an end portion in the axial direction and whose cross section is circular; and a solder supply hole 422 which passes through from the center portion of a bottom portion of the concave portion 421 to the opposite side. The heater block 42 is provided in contact with the cutter lower blade 22 such that the solder supply hole 422 and the lower blade hole 221 communicate with each other. The heater block 42 is provided as described above, and thus the solder piece Wh is moved from the lower blade hole 221 to the solder supply hole 422.

The iron tip 5 is a member which is formed in the shape of a cylinder extended in an up/down direction and which can be heated, and includes a solder hole 51 in a center portion which is extended in the axial direction. The iron tip 5 is inserted into the concave portion 421 and is prevented from being removed with an unillustrated member. The solder hole 51 of the iron tip 5 communicates with the solder supply hole 421 of the heater block 42, and the solder piece Wh is fed from the solder supply hole 421.

The heat from the heater 41 is transmitted to the iron tip 5, and the solder piece Wh is melted by the heat. Hence, the iron tip 5 is formed of a material having a high thermal conductivity, for example, a ceramic such as a silicon carbide or an aluminum nitride or a metal such as tungsten. Although in the soldering device A, the iron tip 5 is formed in the shape of a cylinder, there is no limitation to this configuration, and the iron tip 5 which is formed in the shape of a tube whose cross section is polygonal or oval may be used. The iron tip 5 may be prepared that has a different shape according to the wiring board Bd and (or) the shape of the terminal P of the electronic component Ep on which soldering is performed.

As shown in FIGS. 1 and 2, the solder feed mechanism 6 supplies the wire solder W, and includes a pair of feed rollers 61a and 61b which feed the wire solder W and a guide tube 62 which guides the fed wire solder W to the upper blade hole 211 of the cutter upper blade 21. The pair of feed rollers 61a and 61b are attached to the support portion 1, sandwich the wire solder W and are rotated so as to feed the wire solder W downward. The guide tube 62 is a tubular member which can be elastically deformed, and the upper end thereof is arranged close to a portion of the feed rollers 61 from which the wire solder W is fed.

The lower end of the guide tube 62 is provided so as to communicate with the upper blade hole 211 of the cutter upper blade 21. The lower end of the guide tube 62 is moved so as to follow the sliding of the cutter upper blade 21, and the guide tube 62 is provided so as not to be excessively pulled or stick in the range of the sliding of the cutter upper blade 21. The length of the wire solder fed is determined by the rotation angles (the numbers of revolutions) of the individual feed rollers 61a and 61b.

When the soldering is performed with the soldering device A, the tip end of the iron tip 5 is brought into contact with the land Ld of the wiring board Bd on which the soldering is performed, and the land Ld and the terminal P of the electronic component Ep are surrounded by the iron tip 5. Here, the heat from the heater 41 is transmitted to the iron tip 5, and the iron tip 5 is brought into contact with the land Ld and the terminal P of the electronic component Ep such that they are heated (preheated) to a temperature suitable for the soldering.

[Operation of Soldering Device]

The operation of the soldering device A will then be described. As shown in FIG. 2, immediately before the soldering is performed, the soldering device A is in a state where the piston rod 32 is stored within the air cylinder 31, and the cam member 33 is in an upper portion (the uppermost portion of the range of the sliding) in the Z direction. Here, the pin 332 is located within the first groove portion 341 of the cam groove 340, and the cutter upper blade 21 is located in a position closest to the guide shaft 35. This position is assumed to be the initial position. The cutter upper blade 21 and the cutter lower blade 22 are formed such that when the soldering device A is in the initial position, the upper blade hole 211 and the lower blade hole 221 are overlaid on each other in the Z direction.

Then, the feed rollers 61a and 61b are driven to rotate so as to feed the wire solder W. Since the upper blade hole 211 and the lower blade hole 221 are in a state where they communicate with each other, the tip end of the wire solder W is moved into the lower blade hole 221. The rotation angles of the feed rollers 61a and 61b are adjusted such that the length of the wire solder W entering the lower blade hole 221 is the length of the first solder piece Wh1.

In one round of the soldering, an amount of solder obtained by adding the amount of first solder piece Wh1 and the amount of second solder piece Wh2 is used. With consideration given to this fact, the lengths of the first solder piece Wh1 and the second solder piece Wh2 are determined according to, for example, the sizes of the land Ld and the terminal P of the electronic component Ep on which the soldering is performed. In the present embodiment, the length of the first solder piece Wh1 is set equal to the length of the second solder piece Wh2, and each of the amounts of solder pieces Wh1 and Wh2 is set to the half of the amount of solder necessary for one round of the soldering.

Then, the piston rod 32 is protruded from the air cylinder 31, and thus the cam member 33 is moved downward along the guide shaft 35. Since the pin 332 is arranged within the cam groove 340, the pin 332 slides within the cam axis 340. When the pin 332 is in the first groove portion 341, since the first groove portion 341 coincides with the direction of movement of the pin 332 (the axial direction of the guide shaft 35), the slider portion 34 does not receive a force from the cam member 33, and thus the cam member 34 is stationary. Then, when the pin 332 reaches the connection groove portion 343 from the first groove portion 341, the pin 332 pushes the inner surface of the connection groove portion 343. In this way, a force in the X direction is applied to the slider portion 34, and thus the slider portion 34 and the cutter upper blade 21 formed integrally with the slider portion 34 are moved (slide) in the X direction.

The cutter upper blade 21 slides such that the upper blade hole 211 and the lower blade hole 221 are displaced in the X direction, and thus the cutting blade formed in the edge of the end portion of the upper blade hole 211 intersects the cutting blade formed in the edge of the end portion of the lower blade hole 221. Consequently, the wire solder W is cut, and thus the first solder piece Wh1 is first produced.

When the piston rod 32 is further protruded, the cam member 33 is further moved downward, and thus the pin 332 is moved from the connection groove portion 343 to the second groove portion 342. Since the second groove portion 342 is also extended parallel to the guide shaft 35, even when the cam member 33 is moved downward along the guide shaft 35, the pin 332 does not push the slider portion 34. In other words, although the cam member 33 is moved, the cutter upper blade 21 and the slider portion 34 are stopped. The cutter upper blade 21 is located in a position farthest from the guide shaft 35. The cutter upper blade 21 and the cutter lower blade 22 are formed such that when the cutter upper blade 21 is in this position, the pin hole 212 is overlaid on the lower blade hole 221 in the Z direction.

When the piston rod 32 is much further protruded, the cam member 33 slides downward, and thus the pin pushing portion 333 of the cam member 33 pushes the head portion 232 of the pusher pin 23. In this way, the rod portion 231 of the pusher pin 23 is inserted into the lower blade hole 221. Here, the first solder piece Wh1 which is left in the lower blade hole 221 is pushed by the rod portion 231 so as to be moved toward the iron tip 5. Although the first solder piece Wh1 may be moved downward by its weight at the time of cutting, by the utilization of the pusher pin 23, the first solder piece Wh1 can be reliably supplied into the solder hole 51 of the iron tip 5.

Figure 4:
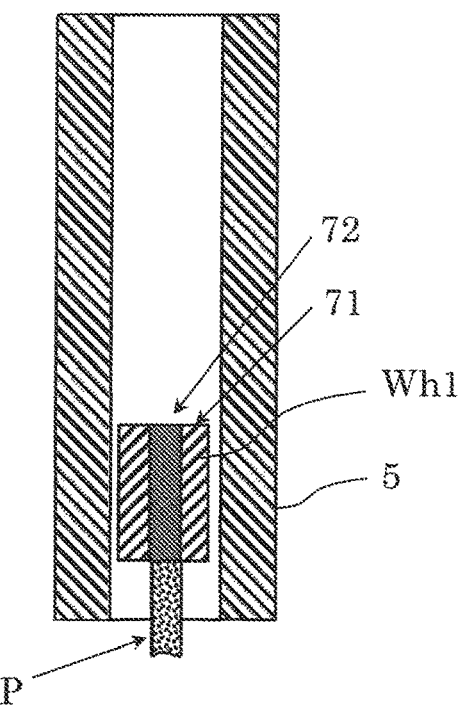
FIG. 4 An illustrative diagram of a state where a first solder piece is held within an iron tip in a first embodiment.

As shown in FIG. 4, the first solder piece Wh1 supplied into the solder hole 51 is held in a state where the first solder piece Wh1 is erected within the iron tip 5 so as to ride on the terminal P of the electronic component Ep. Furthermore, in the soldering device A, as in the case of the first solder piece Wh1, the wire solder W is cut again, and thus the second solder piece Wh2 is produced at this time. The second solder piece Wh2 is also supplied into the solder hole 51 of the iron tip 5 by the utilization of the pusher pin 23 (or by its weight).

Figure 5:
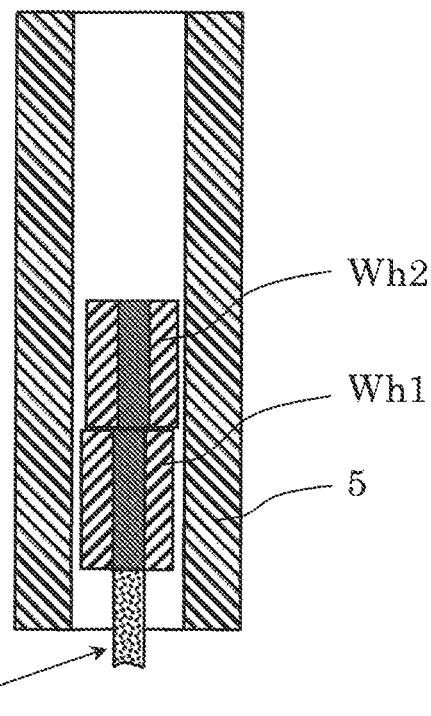
FIG. 5 An illustrative diagram of a state where first and second solder pieces are held within the iron tip in the first embodiment.

Consequently, as shown in FIG. 5, within the iron tip 5, the solder pieces Wh1 and Wh2 are in a state where they are erected such that the second solder piece Wh2 rides on the first solder piece Wh1. As described above, the soldering device A supplies the first solder piece Wh1 and the second solder piece Wh2 in this order from above into the iron tip 5. The inside diameter of the iron tip 5 is set so as to be slightly larger than the outside diameter of each of the solder pieces Wh1 and Wh2. Hence, even when the solder pieces Wh1 and Wh2 are inclined within the iron tip 5, they are supported by the inner wall thereof so as to be erected within the iron tip 5 without fail.

Figure 6:
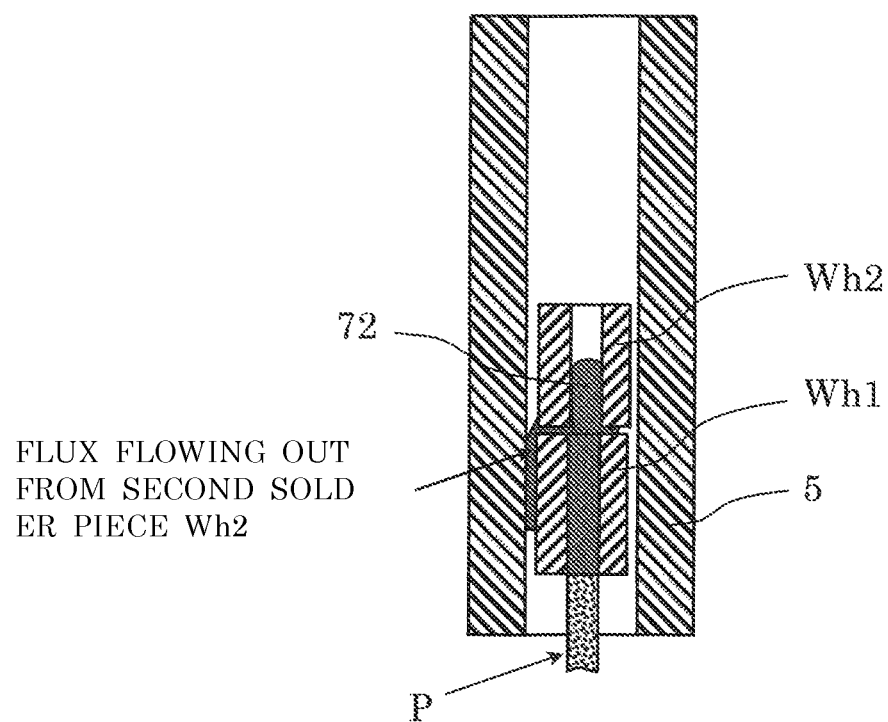
FIG. 6 An illustrative diagram of a case where the iron tip is heated in the state shown in FIG. 5.

The heat from the heater 41 is transmitted to the iron tip 5, and the first solder piece Wh1 and the second solder piece Wh2 are heated by the heat. Here, as shown in FIG. 6, the flux 72 which flows out from the lower end portion of the second solder piece Wh2 flows between the first solder piece Wh1 and the inner wall surface of the iron tip 5. The flux 72 has, for example, as a main component, a rosin which is melted at about 70° C. It is known that the thermal conductivity of a rosin is sufficiently (about 10 times) larger than that of air.

Since the flux 72 flowing therebetween serves as a heat medium (which makes it easy to transmit the heat from the iron tip 5 to the first solder piece Wh1), as compared with a case where the flux 72 does not flow therebetween, the first solder piece Wh1 is melted rapidly and reliably. For example, the flux 72 has a lower melting point than the solder, the second solder piece Wh2 is closer to the heater unit 4 than the first solder piece Wh1 and thus the flux 72 flows out from the second solder piece Wh2 in a relatively early stage. Even when the flux 72 of the second solder piece Wh2 flows out from the upper end portion of the second solder piece Wh2 or from the upper end portion and the lower end portion thereof, the flux 72 likewise serves as the heat medium, and thus the first solder piece Wh1 is melted rapidly and reliably. However, it is likely that when the flux 72 flows out from the upper end portion of the second solder piece Wh2, the second solder piece Wh2 is melted earlier than the first solder piece Wh1, the molten second solder piece Wh2 flows between the first solder piece Wh1 and the inner wall surface of the iron tip 5 and this serves as the heat medium, with the result that the melting of the first solder piece Wh1 is promoted. Through the process described above, finally, both the first solder piece Wh1 and the second solder piece Wh2 are completely heated and melted so as to be supplied onto the wiring board Bd arranged below.

Since the iron tip 5 surrounds the land Ld of the wiring board Bd and the terminal P of the electronic component Ep, the molten solder flows to the land Ld and the terminal P of the electronic component Ep arranged below. Then, the soldering device A is moved in the Z direction, and thus the iron tip 5 is moved away from the land Ld. In this way, the solder is cooled by outside air so as to be solidified, and thus the land Ld and the terminal P of the electronic component Ep are soldered.

Then, when the soldering is completed, the air cylinder 31 stores the piston rod 32 thereinto. In this way, the cam member 33 is moved upward in the Z direction, and the pusher pin 23 is pushed upward by the elastic force of the spring 233. The rod portion 231 is removed from the lower blade hole 221. Even if the cutter upper blade 21 slides in this state, the pusher pin 23 is not broken. Then, the pin 332 of the cam member 33 reaches the connection groove portion 343 of the cam groove 340, and the slider portion 34 and the cutter upper blade 21 slide so as to approach the guide shaft 35. When the pin 332 reaches the first groove portion 341 of the cam groove 340, the soldering device A is returned to the initial position.

2. Second Embodiment

The second embodiment will then be described. The second embodiment is basically the same as the first embodiment except the lengths of the solder pieces. In the following description, emphasis is placed on the description of portions which differ from those in the first embodiment, and the description of the common portions may be omitted.

The soldering device A of the second embodiment cuts the wire solder W such that the second solder piece Wh2 is shorter than the first solder piece Wh1. Specifically, in the present embodiment, the wire solder W is fed out by the solder feed mechanism 6 such that the second solder piece Wh2 is shorter than the first solder piece Wh1, and the wire solder W fed out is cut by the cutter unit 6. The total of the amount of first solder piece Wh1 and the amount of second solder piece Wh2 is adjusted such that the total is the amount of solder necessary for one round of the soldering.

FIG. 7A shows a state where the first solder piece Wh1 is first supplied into the iron tip 5 so as to ride on the terminal P of the electronic component Ep. FIG. 7B shows a state where the second solder piece Wh2 is further supplied so as to ride on the first solder piece Wh1. FIG. 7C shows a state where in the state shown in FIG. 7B, a certain amount of time has elapsed such that the flux 72 flows out from the second solder piece Wh2.

As shown in FIG. 7B, in the present embodiment, the second solder piece Wh2 is shorter than the first solder piece Wh1, and within the iron tip 5, these solder pieces are erected such that the second solder piece Wh2 rides on the first solder piece Wh1. Even in the present embodiment, the inside diameter of the iron tip 5 is set so as to be slightly larger than the outside diameter of each of the solder pieces Wh1 and Wh2. Hence, even when the solder pieces Wh1 and Wh2 are inclined within the iron tip 5, they are supported by the inner wall thereof so as to be erected within the iron tip 5 without fail.

Furthermore, in the present embodiment, the second solder piece Wh2 is shorter than the first solder piece Wh1, and accordingly, the heat capacity is relatively low. Hence, in the present embodiment, as compared with the first embodiment, the second solder piece Wh2 is easily increased in temperature, and thus as shown in FIG. 7C, the flux 72 flows out from the second solder piece Wh2 in an earlier stage.

In this way, in the present embodiment, the first solder piece Wh1 can be melted more rapidly and reliably. The temperature increase of the second solder piece Wh2 is sped up as the second solder piece Wh2 is produced so as to be shorter (as the heat capacity is decreased). With respect to the specific lengths of the solder pieces, for example, the length of the first solder piece Wh1 is set to 15 mm, the length of the second solder piece Wh2 is set to 2 mm and thus it is possible to sufficiently obtain the effects of the present invention.

In terms of enhancing the efficiency of heating of the solder piece, the difference between the inside diameter of the iron tip 5 and the outside diameter of the solder piece is preferably minimized. However, an appropriate clearance is preferably provided between the iron tip 5 and the solder piece so that the supply of the solder piece into the iron tip 5 is not prevented by burrs resulting from the cutting of the solder piece or the deformation of the solder piece. In the present embodiment, with consideration given to what has been described above, the inside diameter of the iron tip 5 is set within a range of 0.7 to 2.3 mm, the outside diameter of the solder piece is set within a range of 0.6 to 1.2 mm and the difference between the inside diameter and the outside diameter is set within a range of 0.2 to 1.1 mm.

3. Third Embodiment

The third embodiment will then be described. The third embodiment is basically the same as the first embodiment except the lengths of the solder pieces and the internal shape of the iron tip. In the following description, emphasis is placed on the description of portions which differ from those in the first embodiment, and the description of the common portions may be omitted.

The soldering device A of the third embodiment cuts the wire solder W such that the first solder piece Wh1 is shorter than the second solder piece Wh2. Specifically, in the present embodiment, the wire solder W is fed out by the solder feed mechanism 6 such that the first solder piece Wh1 is shorter than the second solder piece Wh2, and the wire solder W fed out is cut by the cutter unit 6. The total of the amount of first solder piece Wh1 and the amount of second solder piece Wh2 is adjusted such that the total is the amount of solder necessary for one round of the soldering.

FIG. 8 shows a state where the first solder piece Wh1 is supplied into the iron tip 5. As shown in the figure, in the third embodiment, within the iron tip 5, a reception portion which receives the supplied first solder piece Wh1 is provided. More specifically, the reception portion is a step 5s which is protruded inward from the inner walls of the iron tip 5 such that the inside diameter of the iron tip 5 is less than the outside diameter of the first solder piece Wh1. The inside diameter of the iron tip 5 is slightly larger than the outside diameter of the first solder piece Wh1 on the upper side with respect to the step 5s whereas the inside diameter of the iron tip 5 is slightly smaller than the outside diameter of the first solder piece Wh1 on the lower side with respect to the step 5s.

The step 5s within the iron tip 5 is provided in a position on the upper side with respect to the tip end of the terminal P of the electronic component Ep. Hence, when the first solder piece Wh1 is supplied into the iron tip 5, as shown in FIG. 8, the first solder piece Wh1 is caught on the step 5s within the iron tip 5 before reaching the terminal P, and thus the first solder piece Wh1 can be brought into a state where the first solder piece Wh1 is erected on the step 5s (reception portion).

Figure 9:
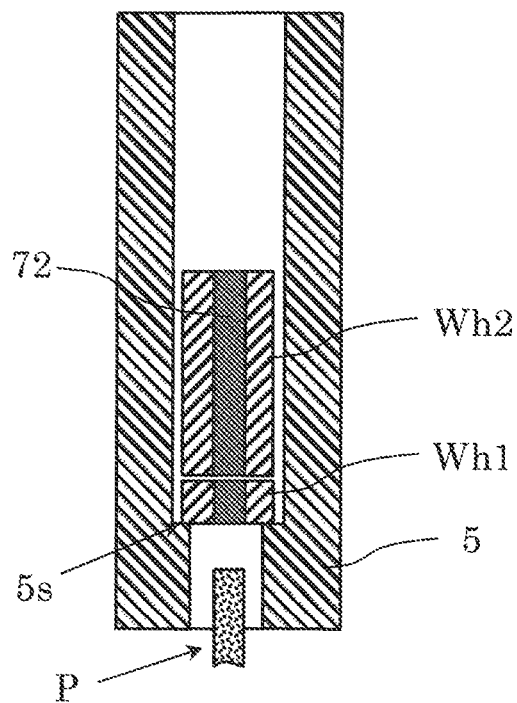
FIG. 9 An illustrative diagram of a state where first and second solder pieces are held within the iron tip in the third embodiment.

FIG. 9 shows a state where in the state of FIG. 8, the second solder piece Wh2 is further supplied. As shown in FIG. 9, in the present embodiment, the first solder piece Wh1 is shorter than the second solder piece Wh2, and within the iron tip 5, the solder pieces are erected such that the second solder piece Wh2 rides on the first solder piece Wh1. The inside diameter of the iron tip 5 on the upper side with respect to the step 5s is set so as to be slightly larger than the outside diameter of each of the solder pieces Wh1 and Wh2. Hence, even when the solder pieces Wh1 and Wh2 are inclined within the iron tip 5, they are supported by the inner wall thereof so as to be erected within the iron tip 5 without fail.

Furthermore, the first solder piece Wh1 in the present embodiment is supplied into the iron tip 5 earlier than the second solder piece Wh2, and the first solder piece Wh1 is shorter than the second solder piece Wh2, and accordingly, the heat capacity is relatively low. Thus, in the present embodiment, the first solder piece Wh1 is increased in temperature more easily than the second solder piece Wh2.

Figure 10:
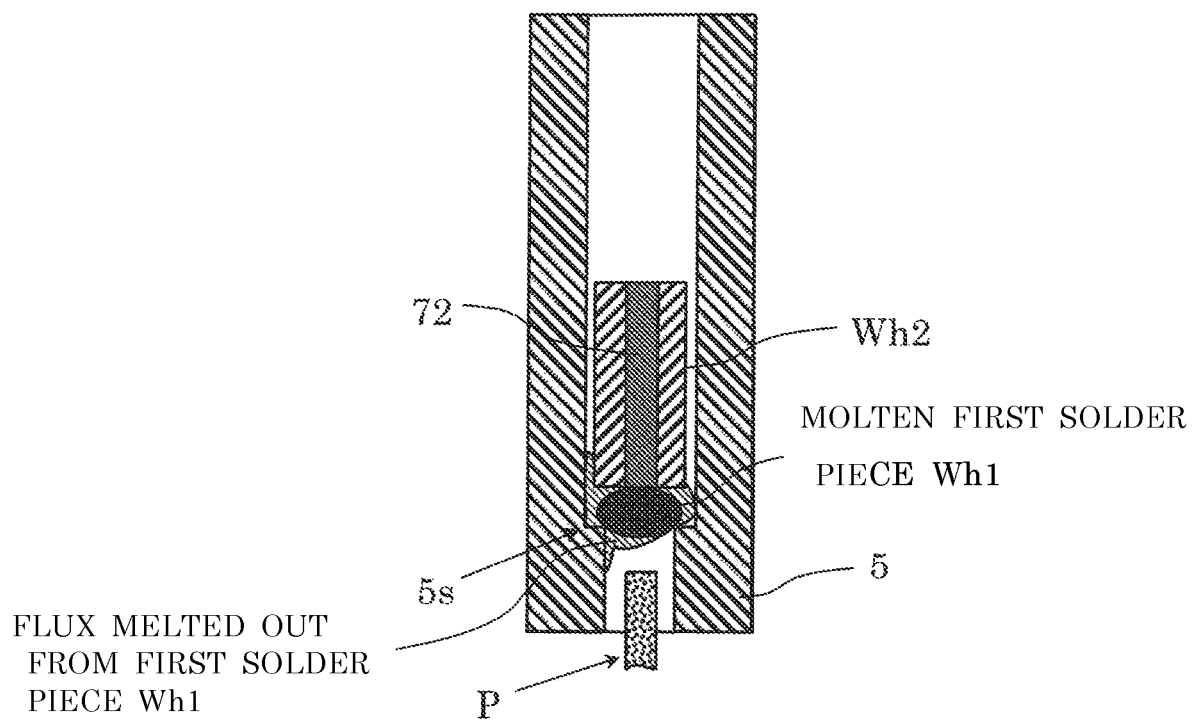
FIG. 10 An illustrative diagram of a case where the iron tip is heated in the state shown in FIG. 9.

Hence, when the iron tip 5 is heated in the state shown in FIG. 9, as shown in FIG. 10, the flux 72 is melted out from the first solder piece Wh1, and the solder 71 is melted. Consequently, heat conduction to the second solder piece Wh2 is performed through the flux 72 melted out from the first solder piece Wh1 and the molten solder 71, and thus together with the first solder piece Wh1, the second solder piece Wh2 can be heated and melted more rapidly and reliably.

4. Others

The soldering device A of each of the embodiments described above includes: the substantially tubular iron tip 5 that can be heated and that is extended vertically; and a functional portion (solder piece supply portion) that supplies the first solder piece Wh1 and the second solder piece Wh2 in which the layer of the flux 72 is provided within the layer of the tubular solder 71 in this order from above into the iron tip 5. In the soldering device A, within the iron tip 5, the solder pieces are erected such that the second solder piece Wh2 rides on the first solder piece Wh1, the heat of the iron tip 5 is used to melt the first solder piece Wh1 and the second solder piece Wh2 and thus the molten solder is supplied downward.

Hence, with the soldering device A, it is possible to more reliably heat and melt the solder pieces in a posture where they are erected within the iron tip 5. The solder piece supply portion included in the soldering device A can also sequentially produce the first solder piece Wh1 and the second solder piece Wh2 by cutting the wire solder W.

The soldering device A of each of the first embodiment and the second embodiment solders, to the wiring board Bd, the terminal P of the electronic component Ep protruded upward. Then, the soldering device A supplies the solder pieces in a state where the tip end of the terminal P enters the iron tip 5 from below, and thereby brings the first solder piece Wh1 into a state where the first solder piece Wh1 is erected on the tip end of the terminal P. In the case of the second embodiment, the solder piece supply portion cuts the wire solder W such that the second solder piece Wh2 is shorter than the first solder piece Wh1.

On the other hand, within the iron tip 5 in the soldering device A of the third embodiment, the reception portion for receiving the supplied first solder piece Wh1 is provided, and thus the first solder piece Wh1 can be brought into a state where the first solder piece Wh1 is erected on the reception portion. Although in the present embodiment, as the specific form of the reception portion, the step 5s is adopted which is protruded inward from the inner walls of the iron tip 5, another form may be adopted. The solder piece supply portion cuts the wire solder W such that the first solder piece Wh1 is shorter than the second solder piece Wh2.

Although the embodiments of the present invention have been described above, the present invention is not limited to the details thereof. In the embodiments of the present invention, various variations can be added without departing from the spirit of the invention.

REFERENCE SIGNS LIST

A soldering device (solder processing device)
1 support portion
11 wall member
12 holding portion
13 sliding guide
14 heater unit fixing portion
15 actuator holding portion
16 spring holding portion
2 cutter unit
21 cutter upper blade
211 upper blade hole
212 pin hole
22 cutter lower blade
221 lower blade hole
23 pusher pin 231 rod portion
232 head portion
233 spring
3 drive mechanism
31 air cylinder
32 piston rod
33 cam member
330 concave portion
331 support hole
332 pin
333 pin pushing portion
334 bearing
34 slider portion
340 cam groove
341 first groove portion
342 second groove portion
343 connection groove portion
35 guide shaft
4 heater unit
41 heater
42 heater block
421 concave portion
422 solder supply hole
5 iron tip
5s step
51 solder hole
6 solder feed mechanism
61a, 61b feed roller
62 guide tube
71 solder
72 flux
P terminal
W wire solder
Wh solder piece
Wh1 first solder piece
Wh2 second solder piece
Bd wiring board
Ep electronic component
Ld land

The invention claimed is:

1. A solder processing device comprising:
a substantially tubular iron tip that is extended vertically;
a solder piece supply portion that sequentially supplies, into the substantially tubular iron tip, a plurality of solder pieces, each of which includes a tubular solder layer and a layer of a flux provided within the tubular solder layer;
a drive mechanism that drives the solder piece supply portion to sequentially supply at least two solder pieces from above into the substantially tubular iron tip, such that the at least two solder pieces are erected in the substantially tubular iron tip in such a manner that on the solder piece which is first supplied, the solder piece which is subsequently supplied rides;
a heater that heats the substantially tubular iron tip in a state where the at least two solder pieces are erected in the substantially tubular iron tip in such a manner that on the solder piece which is first supplied, the solder piece which is subsequently supplied rides, to melt the flux to be flown out from at least one of the at least two solder pieces to a space between an inner wall of the substantially tubular iron tip and the at least two solder pieces, thereby enhancing contactability between the inner wall of the substantially tubular iron tip and the at least two solder pieces to melt the at least two solder pieces such that a molten solder is supplied downward from the substantially tubular iron tip; and
a heater block including a solder supply hole in a center thereof, wherein the heater is wound around an outer circumferential surface of the heater block.

2. The solder processing device according to claim 1, wherein the solder piece supply portion sequentially produces a first solder piece and a second solder piece by cutting a wire solder, and supplies the first and second solder pieces into the substantially tubular iron tip.

3. The solder processing device according to claim 2, wherein the solder piece supply portion cuts the wire solder such that the first solder piece differs in length from the second solder piece.

4. The solder processing device according to claim 2, wherein subsequently supplying of the first and second solder pieces is performed in a state where a tip end of a terminal protruded upward from a board enters the substantially tubular iron tip from below such that the first solder piece is erected on the tip end of the terminal.

5. The solder processing device according to claim 4, wherein the solder piece supply portion cuts the wire solder such that the second solder piece is shorter than the first solder piece.

6. The solder processing device according to claim 2, wherein within the substantially tubular iron tip, a reception portion which receives the supplied first solder piece is provided, and
the first solder piece is erected on the reception portion.

7. The solder processing device according to claim 6, wherein the reception portion is protruded inward from the inner wall of the substantially tubular iron tip such that an inside diameter of the substantially tubular iron tip is smaller than an outside diameter of the first solder piece.

8. The solder processing device according to claim 6, wherein the solder piece supply portion cuts the wire solder such that the first solder piece is shorter than the second solder piece.

9. The solder processing device according to claim 1, wherein the substantially tubular iron tip is formed of a ceramic.

10. The solder processing device according to claim 1, wherein the heater is provided around an upper portion of the substantially tubular iron tip such that the solder piece which is subsequently supplied riding on the solder piece which is first supplied in the substantially tubular iron tip is closer to the heater than the solder piece which is first supplied.

11. The solder processing device according to claim 1, wherein
the substantially tubular iron tip includes a solder hole in which the at least two solder pieces are subsequently supplied and erected, and
the solder supply hole of the heater block is connected to and communicated with the solder hole of the substantially tubular iron tip.

12. The solder processing device according to claim 1, wherein
the heater block further includes a concave portion to which the substantially tubular iron tip is attached in such a manner that the solder supply hole of the heater block is connected to and communicated with a solder hole of the substantially tubular iron tip, in which the at least two solder pieces are subsequently supplied and erected.

13. The solder processing device according to claim 1, wherein an inside diameter of the substantially tubular iron tip is slightly larger than an outside diameter of the at least two solder pieces, such that the at least two solder pieces are erected in the substantially tubular iron tip in such a manner that on the solder piece which is first supplied, the solder piece which is subsequently supplied rides.

* * * * *